(12) United States Patent
Umeda et al.

(10) Patent No.: US 10,615,092 B2
(45) Date of Patent: Apr. 7, 2020

(54) ELECTRONIC DEVICE

(71) Applicant: SHINDENGEN ELECTRIC MANUFACTURING CO., LTD., Tokyo (JP)

(72) Inventors: Soichiro Umeda, Hanno (JP); Yuji Morinaga, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 109 days.

(21) Appl. No.: 15/753,527

(22) PCT Filed: Feb. 20, 2017

(86) PCT No.: PCT/JP2017/006031
§ 371 (c)(1),
(2) Date: Feb. 19, 2018

(87) PCT Pub. No.: WO2018/150560
PCT Pub. Date: Aug. 23, 2018

(65) Prior Publication Data
US 2019/0237377 A1 Aug. 1, 2019

(51) Int. Cl.
*H01L 23/00* (2006.01)
*H01L 23/31* (2006.01)
(Continued)

(52) U.S. Cl.
CPC .......... *H01L 23/3121* (2013.01); *H01L 23/12* (2013.01); *H01L 23/562* (2013.01);
(Continued)

(58) Field of Classification Search
None
See application file for complete search history.

(56) References Cited

U.S. PATENT DOCUMENTS 6,249,041 B1    6/2001  Kasem et al.
9,455,157 B1 *  9/2016  Jain .................. H01L 23/49541
                        (Continued)

FOREIGN PATENT DOCUMENTS

JP    H08023145 A    1/1996
JP    2002083890 A   3/2002
                    (Continued)

OTHER PUBLICATIONS

International Search Report for PCT/JP2017/006031, dated Apr. 11, 2017, and its English translation provided by Google Translate.
(Continued)

*Primary Examiner* — Reema Patel
(74) *Attorney, Agent, or Firm* — Ladas & Parry, LLP

(57) ABSTRACT

An electronic device has a substrate 5, a first conductor layer 71 provided on the substrate 5, a second conductor layer 72 provided on the substrate 5; an electronic element provided on the first conductor layer 71, and a sealing part 90 covering the substrate 5, the first conductor layer 71, the second conductor layer 72, and the electronic element 95. The first conductor layer 71 is not provided on a virtual straight line VL including the second conductor layer 72 in an in-plane direction of the substrate 5. The second conductor layer 72 is sealed inside the sealing part 90 and covered only with the sealing part 90.

6 Claims, 7 Drawing Sheets

(51) Int. Cl.
  *H01L 23/12* (2006.01)
  *H01L 25/07* (2006.01)
  *H05K 1/02* (2006.01)
  *H01L 25/18* (2006.01)

(52) U.S. Cl.
  CPC .............. *H01L 25/07* (2013.01); *H01L 25/18* (2013.01); *H05K 1/02* (2013.01); *H01L 23/3107* (2013.01); *H01L 2224/0603* (2013.01); *H01L 2224/48247* (2013.01); *H01L 2224/4903* (2013.01); *H01L 2224/49431* (2013.01)

(56) References Cited

U.S. PATENT DOCUMENTS

| | | |
|---|---|---|
| 2008/0073784 A1 | 3/2008 | Lee |
| 2013/0087813 A1 | 4/2013 | Yan et al. |
| 2014/0239318 A1 | 8/2014 | Oyu |

FOREIGN PATENT DOCUMENTS

| | | |
|---|---|---|
| JP | 2007019123 A | 1/2007 |
| JP | 2008085340 A | 4/2008 |
| JP | 2008186919 A | 8/2008 |
| JP | 2013034022 A | 2/2013 |
| JP | 2013084960 A | 5/2013 |
| JP | 2014195064 A | 10/2014 |
| KR | 20000005823 A | 1/2000 |

OTHER PUBLICATIONS

International Preliminary Examination Report for PCT/JP2017/006031, dated Jul. 18, 2017, and its English translation provided by Google Translate.
Written Opinion for PCT/JP2017/006031, dated Apr. 11, 2017, and its English translation provided by Google Translate.
Grant of Patent from KR app. No. 10-2018-7008211, dated Jun. 18, 2019, with English translation from KIPO.

* cited by examiner

ELECTRONIC DEVICE

CROSS-REFERENCE TO RELATED APPLICATION

The present application is the U.S. national phase of PCT Application PCT/JP2017/006031 filed on Feb. 20, 2017, the disclosure of which is incorporated herein by reference in its entirety.

TECHNICAL FIELD

The present invention relates to an electronic device.

BACKGROUND ART

In the related, there is a known semiconductor device that is an example of an electronic device in which a semiconductor element that is an example of an electronic element is placed on a conductor layer of a substrate, a surface of the semiconductor element and a terminal are connected with a wire or a connector via a solder, and the above conductor layer, semiconductor element, wire, connector, and the like are sealed with a sealing part such as a sealing resin (refer to JP 2014-195064 A). In such a semiconductor device, in the case where a region on which no conductor layer is located is long on the substrate, the substrate may be largely warped.

SUMMARY OF INVENTION

Technical Problem

Considering an above-described point, the present invention provides an electronic device in which a substrate can be prevented from being largely warped.

Solution to Problem

An electronic device according to the present invention comprises:
a substrate;
a first conductor layer provided on the substrate;
a second conductor layer provided on the substrate;
an electronic element provided on the first conductor layer; and
a sealing part covering the substrate, the first conductor layer, the second conductor layer, and the electronic element,
wherein the first conductor layer is not provided on a virtual straight line including the second conductor layer in an in-plane direction of the substrate, and
wherein the second conductor layer is sealed inside the sealing part and covered only with the sealing part.

In the electronic device according to the present invention,
a pair of the second conductor layers may be provided, and
a straight line that connects the pair of second conductor layers may coincide with the virtual straight line.

In the electronic device according to the present invention,
one of the second conductor layers may be located at one end part of the substrate and the other second conductor layer may be located at the other end part of the substrate.

In the electronic device according to the present invention,
a plurality of the first conductor layers may be arranged line-symmetrically with respect to the virtual straight line.

In the electronic device according to the present invention,
wherein a plurality of the second conductor layers are provided,
a certain virtual straight line and a different virtual straight line may be provided in parallel, and
a second conductor layer on the certain virtual straight line may be provided on one side, and a second conductor layer on the different virtual straight line is provided on the other side.

In the electronic device according to the present invention,
a plurality of the second conductor layers may be provided,
second conductor layers on a virtual straight line along a longitudinal direction of the substrate may be provided in a pair and
a second conductor layer on a virtual straight line in a short direction of the substrate may not be formed in a pair.

Advantageous Effects of Invention

According to the present invention, the second conductor layer that is dummy is provided on the virtual straight line where no first conductor layer is provided. The substrate can be prevented from being warped largely by providing such second conductor layers.

DESCRIPTION OF EMBODIMENTS

First Embodiment

<<Structure>>

Figure 1:
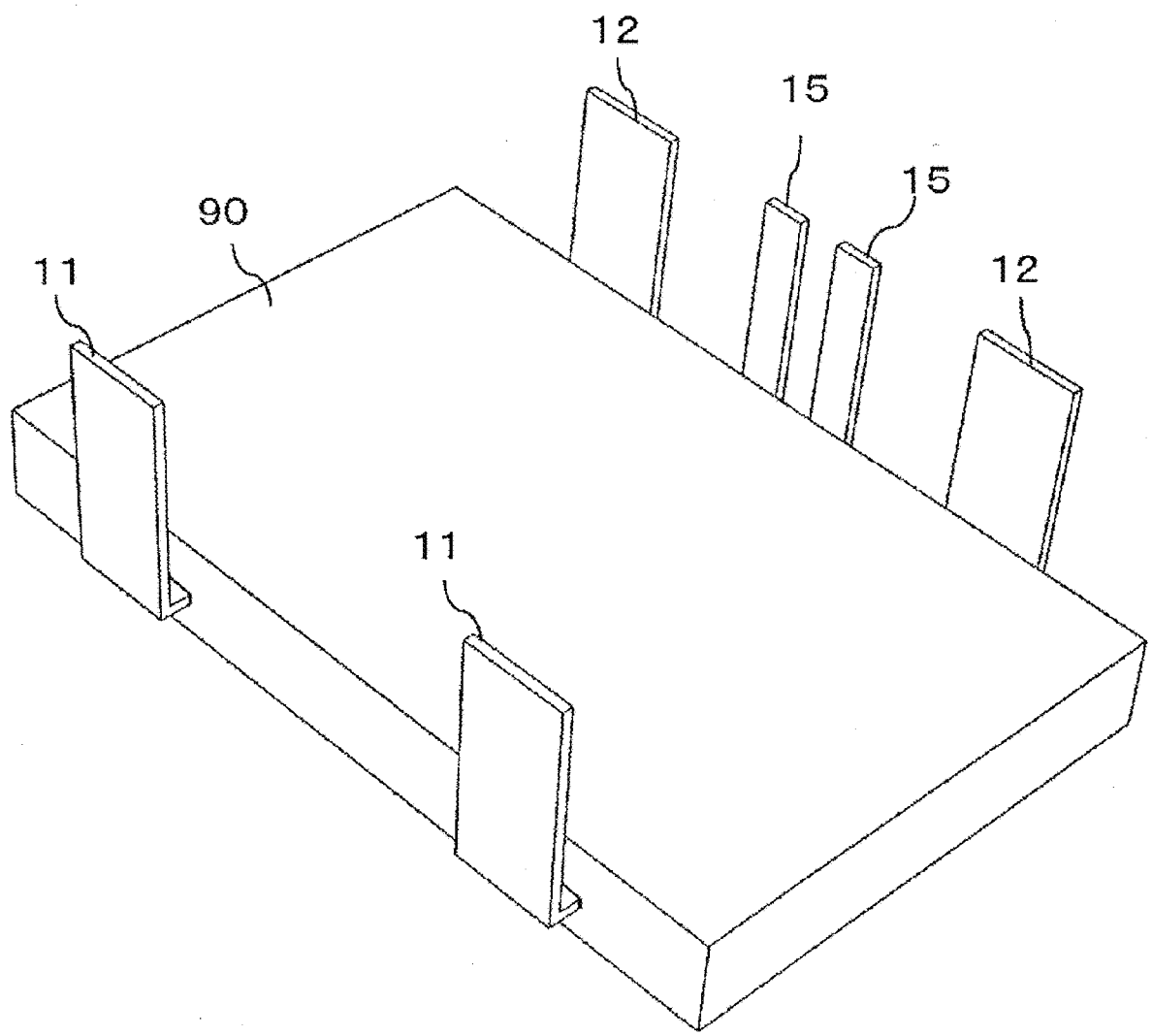
FIG. 1 is a perspective view of a semiconductor device according to a first embodiment of the present invention.
Figure 2:
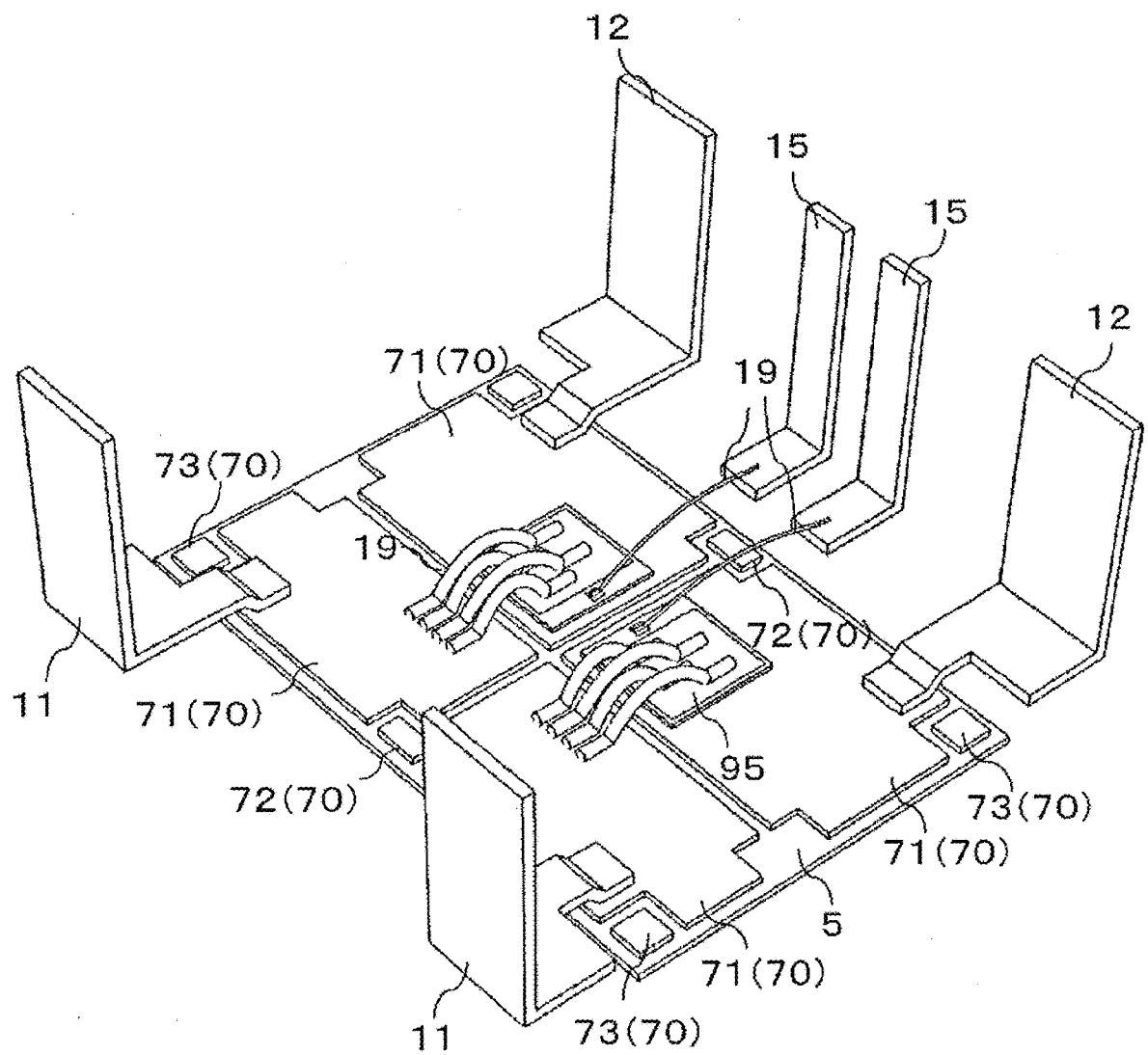
FIG. 2 is a perspective view illustrating an aspect of the semiconductor device according to the first embodiment of the present invention in which a sealing part is removed.

As illustrated in FIG. 2, a semiconductor device that is an example of an electronic device of the present embodiment may have: a sealing part 90 (refer to FIG. 1) made of a sealing resin or the like; a first main terminal 11 projecting outward from a first side surface of the sealing part 90; and a semiconductor element 95 that is an example of an electronic element provided inside the sealing part 90.

In the present embodiment, a description will be given by using a semiconductor device as an electronic device and using a semiconductor element 95 as an electronic element, but not limited thereto, particularly, it is not needed to be a "semiconductor".

The semiconductor device of the present embodiment also has a second main terminal 12 that projects outward from the sealing part 90 and allows main current to flow therein. The semiconductor element 95 illustrated in FIG. 2 has a front surface electrically connected to the first main terminal 11 and has a back surface electrically connected to the second main terminal 12.

As illustrated in FIG. 2, the semiconductor device may have: a substrate 5 made of, for example, an insulating material; and a conductor layer 70 provided on the substrate 5 and made of copper or the like. The conductor layer 70 may have a first conductor layer 71, a second conductor layer 72, and a third conductor layer 73. The semiconductor element 95 is provided at a part of the first conductor layer 71, a wire 19 is provided at a different part of the first conductor layer 71, and the semiconductor element 95 may not be constantly provided in the second conductor layer 72 and the third conductor layer 73. The third conductor layer 73 may correspond to a part to be pressed when pressed with a metal mold. In the case where the third conductor layer 73 is thus pressed with the metal mold, the third conductor layer 73 may be located outside the sealing part 90 (refer to FIG. 3). Additionally, the sealing part 90 may cover the substrate 5, the first conductor layer 71, the second conductor layer 72, and the semiconductor element 95. As the substrate 5, a ceramic substrate, a resin substrate, or the like can also be used. Also, a (thin) metal substrate can also be used although the metal substrate is a conductive material.

The first conductor layer 71 may not be provided on a virtual straight line VL including the second conductor layer 72 in an in-plane direction of the substrate 5 (direction including a paper face of FIG. 3), and the second conductor layer 72 may be completely sealed inside the sealing part 90 and covered only with the sealing part 90. The second conductor layer 72 is a dummy conductor layer in which neither the semiconductor element 95 is placed nor the wire 19 is connected, and the second conductor layer 72 is covered only by the sealing part 90. In the case where a straight line including the second conductor layer 72 is drawn in the in-plane direction of the substrate 5 and the first conductor layer 71 is not provided on the straight line, this indicates that "the first conductor layer 71 is not provided on the virtual straight line VL corresponding to the in-plane direction of the substrate 5 and including the second conductor layer 72".

Additionally, a pair of the second conductor layers 72 may be provided, and a straight line that connects the pair of second conductor layers 72 may coincide with the virtual straight line VL. According to an aspect illustrated in FIG. 3, a straight line that connects centers of the pair of second conductor layers 72 coincides with the virtual straight line VL. In the case where three or more plural second conductor layers 72 are provided, a pair of second conductor layers 72 may be formed by appropriately selecting two second conductor layers 72 (refer to FIGS. 4 and 5 of the second embodiment).

Also, one of the second conductor layers 72 may be located at one end part of the substrate 5 and the other second conductor layer 72 may be located at the other end part of the substrate 5. Here, the "end part" means a position within ⅒ of a length in the substrate 5 along the virtual straight line VL from a peripheral edge.

Figure 3:
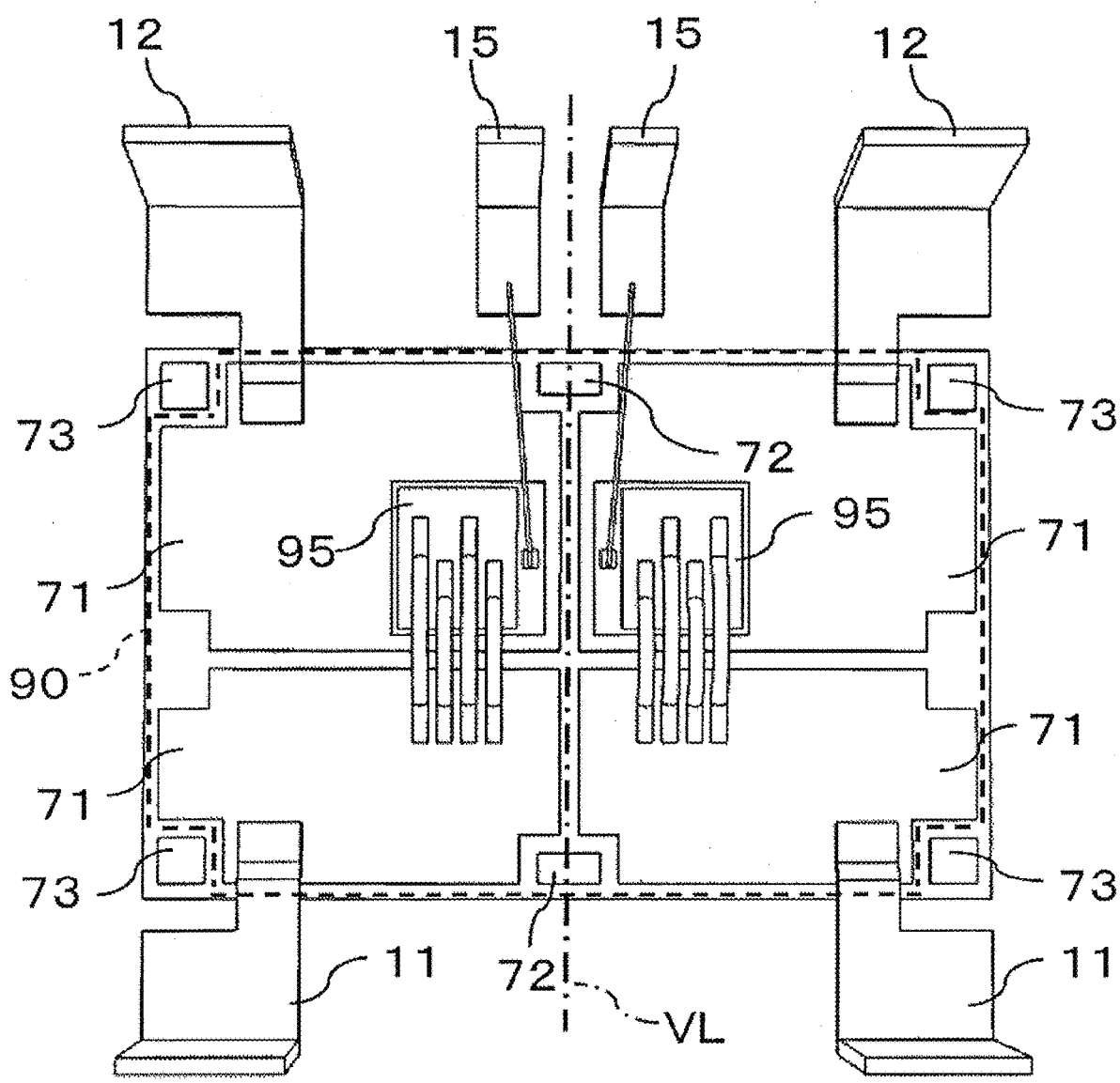
FIG. 3 is a plan view illustrating the aspect of the semiconductor device according to the first embodiment of the present invention in which the sealing part is removed.

As illustrated in FIG. 3, a pair of first main terminals 11 may be arranged line-symmetrically with respect to the virtual straight line VL. Also, a pair of second main terminals 12 may be arranged line-symmetrically with respect to the virtual straight line VL. A distance between the pair of first main terminals 11 is shorter than a distance between the pair of second main terminals 12, and one of the second conductor layers 72 may be located between the first main terminals 11, and the other one of the second conductor layers 72 may be located between the second main terminals 12. In this case, a width of the second conductor layer 72 located between the first main terminals 11 may be longer than a width of the second conductor layer 72 located between the second main terminals 12. Conversely, the distance between the pair of first main terminals 11 may be longer than the distance between the pair of second main terminals 12, and the width of the second conductor layer 72 located between the first main terminals 11 may be shorter than the width of the second conductor layer 72 located between the second main terminals 12. Note that the "width" may be a length in a direction orthogonal to the virtual straight line VL, or may be a length in a direction along the virtual straight line VL.

All or part of a plurality of first conductor layers 71 may be arranged line-symmetrically with the virtual straight line VL.

Two or all (three) out of the first conductor layer 71, second conductor layer 72 and third conductor layer 73 may be produced by the same manufacturing method. Two or all (three) out of a thickness of the first conductor layer 71, a thickness of the second conductor layer 72, and a thickness of the third conductor layer 73 may correspond to each other. Here, "correspond" means that the thicknesses of all conductor layers are included in a range of ±5% of an average value of the thicknesses of the subject conductor layers. Additionally, the substrate 5 can be prevented from being warped by making the thickness of the second conductor layer 72 thicker than the thickness of the first conductor layer 71, or conversely, by making the thickness of the dummy second conductor layer 72 thinner than the thickness of the first conductor layer 71.

According to an aspect illustrated in FIG. 2, the second main terminal 12 is connected to the first conductor layer 71, and the second main terminal 12 is connected to a back surface of the semiconductor element 95 via the first conductor layer 71. A resist (not illustrated) to prevent a conductive adhesive like a solder from flowing out may be provided at a peripheral edge of a connecting point of the second main terminal 12 with the first conductor layer 71.

The first main terminal 11 and the second main terminal 12 may also be power terminals in which large capacity current of about 200 A to 300 A flows.

According to an aspect illustrated in FIG. 1, the second main terminal 12 and the control terminal 15 project outward from a side surface on one side of the sealing part 90, and the first main terminal 11 projects outward from the side surface on the other side of the sealing part 90. The first main terminal 11, second main terminal 12, and control terminal 15 are bent toward the front surface side and connected to a control board provided on the front surface side. The control substrate is used to control the semiconductor element 95.

A structure inside the sealing part 90 of the semiconductor device may be line-symmetric. According to the aspect illustrated in FIG. 3, the first main terminals 11, the second main terminals 12, and the conductor layers 70 (first conductor layers 71, second conductor layers 72, and third conductor layers 73) are line-symmetrically arranged with respect to the virtual straight line VL, respectively.

<<Operations and Effects>>

Next, operations and effects according to the present embodiment having the above-described structure will be described. Note that a structure described in the "Functions and Effects" can also be suitably adopted.

According to the present embodiment, as illustrated in FIG. 3, the second conductor layers 72 that are dummies are provided on the virtual straight line VL where no first conductor layer 71 is provided. The substrate 5 can be prevented from being warped largely by providing such second conductor layers 72.

As illustrated in FIG. 3, in the case of adopting the aspect in which a pair of second conductor layers 72 is provided and the straight line that connects the pair of second conductor layers 72 coincides with the virtual straight line VL, at least two second conductor layers 72 can be provided on the virtual straight line VL. Therefore, the substrate 5 can be more surely prevented from being warped.

In the case of adopting an aspect in which one of the second conductor layers 72 is located at one end part of the substrate 5 and the other second conductor layer 72 is located at the other end part of the substrate 5, the substrate 5 can be more surely prevented from being warped because the second conductor layers 72 can be located close to the peripheral edges. Furthermore, in the case where a second conductor layer 72 is provided at a center part in the in-plane direction of the substrate 5, the second conductor layer 72 may become an obstacle in the case of providing another member, however; occurrence of such a situation can be prevented as much as possible by providing the second conductor layer 72 at each end part of the substrate 5.

In the case where the all or part of the plurality of first conductor layers 71 is arranged line-symmetrically with respect to the virtual straight line VL, the first conductor layer 71 is not provided on a certain virtual straight line in many cases. Due to this, the substrate 5 may be warped in some cases. Therefore, it is advantageous to provide the second conductor layers 72 like the present embodiment. Particularly, in the case where all of the plural first conductor layers 71 are arranged line-symmetrically with respect to the virtual straight line VL, there is high possibility that the first conductor layer 71 is not provided on a certain virtual straight line. Therefore, there is high possibility that a problem of warpage of the substrate 5 is caused. Accordingly, it is extremely advantageous to provide the second conductor layers 72 like the present embodiment in such an aspect.

Second Embodiment

Next, a second embodiment of the present invention will be described.

In the first embodiment, a description has been provided by using an aspect in which one pair of second conductor layers 72 is provided, but in the second embodiment, a description will be provided by using an aspect in which plural pairs of second conductor layers 72 are provided and/or an aspect in which second conductor layers 72 which are not paired are provided.

Other structures are the same as those in the first embodiment. In the second embodiment, a member same as or similar to that of the first embodiment will be denoted by the same reference sign, and a description therefor will be omitted. Additionally, same effects achieved by the first embodiment can be also achieved by the present embodiment.

Figure 4:
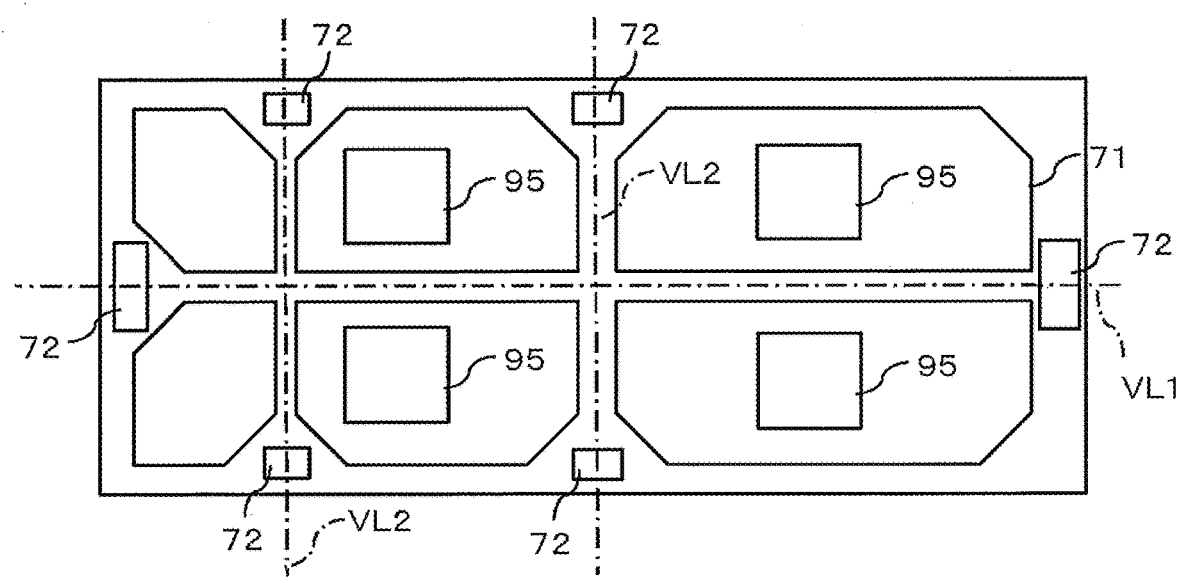
FIG. 4 is a plan view illustrating a positional relation between conductor layers in the semiconductor device according to a second embodiment of the present invention.
Figure 5:
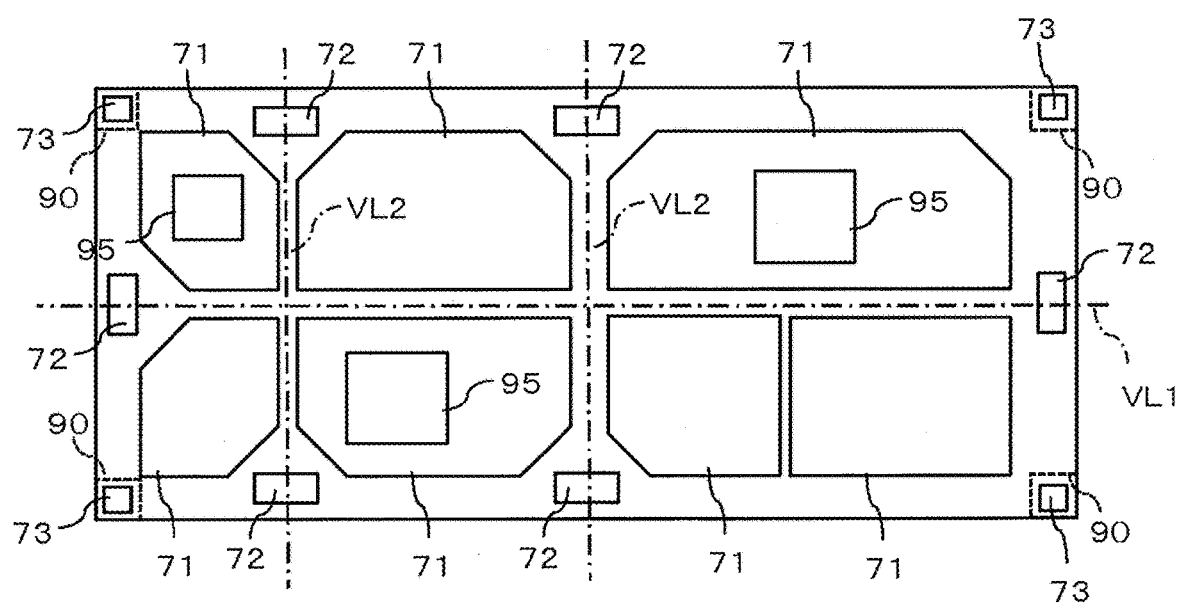
FIG. 5 is a plan view illustrating a positional relation between the conductor layers in a semiconductor device according to a first modified example of the second embodiment of the present invention.

According to aspects illustrated in FIGS. 4 and 5, two virtual straight lines VL along a short direction can be drawn, and one virtual straight line VL along a longitudinal direction can be drawn. Then, a pair of second conductor layers 72 is provided in each of the virtual straight lines VL. Additionally, each of the second conductor layers 72 is located at each of end parts of a substrate 5. Thus, providing three or more second conductor layers 72 is advantageous in that the substrate 5 can be more surely prevented from being warped. Note that no third conductor layer 73 is provided in the aspect illustrated in FIG. 4.

Additionally, widths of the second conductor layers 72 may be different from each other. For example, as illustrated in FIG. 4, a width of a second conductor layer 72 located in the virtual straight line VL1 in the longitudinal direction may be longer than a width of a second conductor layer 72 located in the virtual straight line VL2 in the short direction.

Furthermore, thicknesses of the second conductor layers 72 may be different from each other. For example, a thickness of the second conductor layer 72 located in the virtual straight line VL1 in the longitudinal direction may be thicker than a thickness of the second conductor layer 72 located in the virtual straight line VL2 in the short direction.

Figure 6:
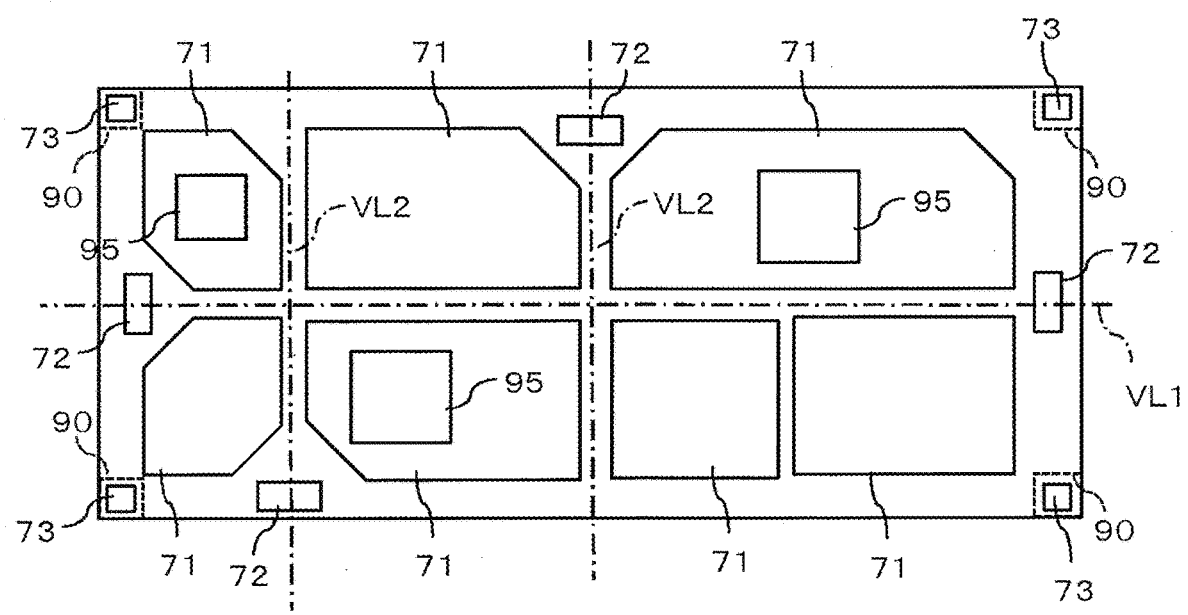
FIG. 6 is a plan view illustrating a positional relation between conductor layers in a semiconductor device according to a second modified example of the second embodiment of the present invention.

As illustrated in FIG. 6, second conductor layers 72 on a virtual straight line VL1 along the longitudinal direction of the substrate 5 may be provided in a pair while second conductor layers 72 on virtual straight lines VL2 in the short direction of the substrate 5 may not be necessarily formed in a pair. Since the substrate 5 is likely to be largely warped in the longitudinal direction, adopting such an aspect is advantageous in that the substrate 5 can be prevented from being warped as much as possible while the number of second conductor layers 72 that are dummies can be reduced.

A certain virtual straight line VL and a different virtual straight line VL may be provided in parallel, a second conductor layer 72 on the certain virtual straight line VL may be provided on one side, and a second conductor layer 72 on the different virtual straight line VL may be provided on the other side. Adopting such an aspect is advantageous in that the second conductor layers 72 can be located in the both directions and the substrate 5 can be prevented from being warped as much as possible even in the case where second conductor layer 72 is provided on the different virtual straight lines VL2 due to a space problem or the like. According to an aspect illustrated in FIG. 6, the second conductor layer 72 located in a virtual straight line VL2 in a short direction on a left side of FIG. 6 is provided at an end part on a lower side of FIG. 6, and the second conductor layer 72 located on a virtual straight line VL2 in the short direction on a right side of FIG. 6 is provided at an end part on an upper side of FIG. 6.

Figure 7:
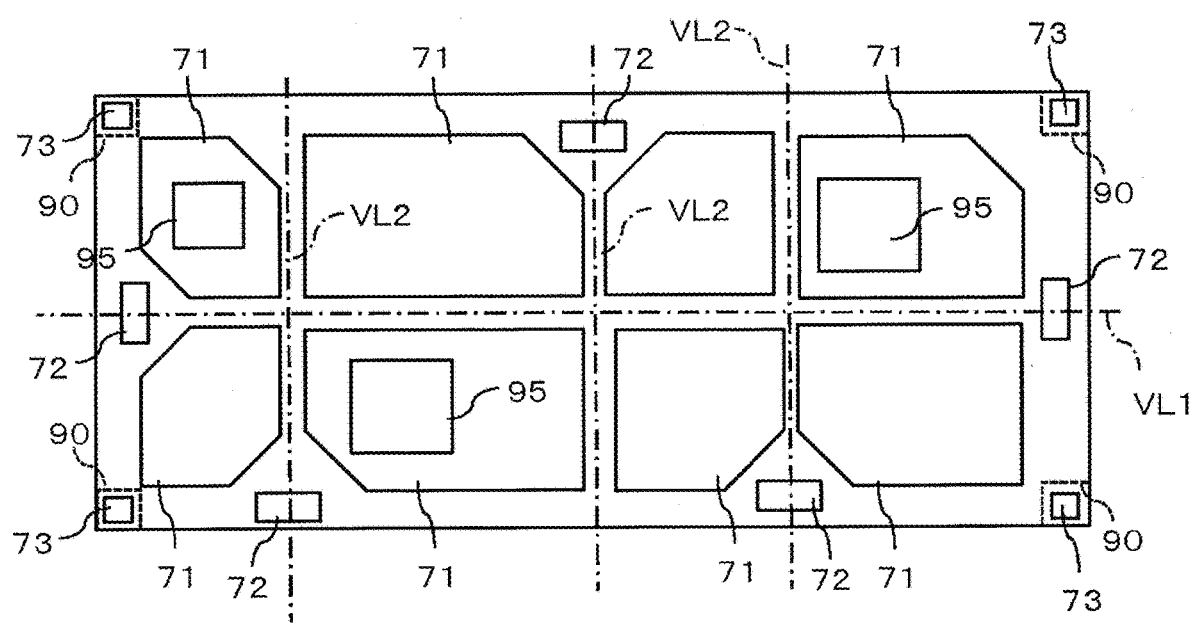
FIG. 7 is a plan view illustrating a positional relation between conductor layers in a semiconductor device according to a third modified example of the second embodiment of the present invention.

Additionally, in an aspect in which three or more virtual straight lines VL are provided in parallel, second conductor layers 72 may be alternately arranged on one side and the other side. Adopting such an aspect is advantageous in that the second conductor layers 72 can be located in the both directions with good balance and the substrate 5 can be prevented from being warped as much as possible even in the case where the second conductor layer 72 is provided on the different virtual straight lines VL2 due to a space problem or the like. According to an aspect illustrated in FIG. 7, a second conductor layer 72 located in a virtual straight line VL2 in a short direction on a left side of FIG. 7 is provided at an end part on a lower side of FIG. 7, a second conductor layer 72 located in a virtual straight line VL2 in the short direction at a center of FIG. 7 is provided at an end part on an upper side of FIG. 7, and a second conductor layer 72 located in a virtual straight line VL2 in the short direction on a right side of FIG. 7 is provided at an end part on the lower side of FIG. 7.

Lastly, note that the matters specified in the above-described respective embodiments and modified examples and disclosure of the drawings are merely examples to describe the invention specified in the scope of claims, and the invention specified in the scope of claims is not limited by the matters specified in the above-described embodiments and the disclosure of the drawings. Additionally, the description in the claims of the original application as of the filing is merely an example, and the description in the claims can be appropriately changed on the basis of the matters specified in the specification, drawings, and the like.

Lastly, the description of the embodiment and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like.

REFERENCE SIGNS LIST

5 Substrate
11 First main terminal
12 Second main terminal
71 First conductor layer
72 Second conductor layer
73 Third conductor layer
90 Sealing part
95 Semiconductor element (electronic element)
VL Virtual straight line

The invention claimed is:

1. An electronic device comprising:
   a substrate;
   a plurality of first conductor layers provided on the substrate;
   a second conductor layer provided on the substrate;
   a first electronic element provided on a first one of the first conductor layers;
   a second electronic element, a wire or a connector provided on a second one of the first conductor layers; and
   a sealing part covering at least the substrate, the first conductor layers, the second conductor layer, the first electronic element, and the second electronic element, the wire or the connector,
   wherein the first conductor layers are not provided on a virtual straight line including the second conductor layer in an in-plane direction of the substrate,
   wherein the virtual straight line passes through between the first one of the first conductor layers, on which the first electronic element is provided, and the second one of the first conductor layers, on which the second electronic element, the wire or the connector is provided, in the in-plane direction of the substrate, and
   wherein the second conductor layer is sealed inside the sealing part and covered only with the sealing part.

2. An electronic device according to claim 1,
   wherein a pair of the second conductor layers are provided, and
   wherein a straight line that connects the pair of second conductor layers coincides with the virtual straight line.

3. An electronic device according to claim 2,
   wherein one of the second conductor layers is located at one end part of the substrate and the other second conductor layer is located at the other end part of the substrate.

4. An electronic device according to claim 1,
   wherein a plurality of the first conductor layers are arranged line-symmetrically with respect to the virtual straight line.

5. An electronic device according to claim 1,
   wherein a plurality of the second conductor layers are provided,
   wherein a certain virtual straight line and a different virtual straight line are provided in parallel, and
   wherein a second conductor layer on the certain virtual straight line is provided on one side, and a second conductor layer on the different virtual straight line is provided on the other side.

6. An electronic device according to claim 1,
   wherein a plurality of the second conductor layers are provided,
   wherein second conductor layers on a virtual straight line along a longitudinal direction of the substrate are provided in a pair and
   wherein a second conductor layer on a virtual straight line in a short direction of the substrate is not formed in a pair.

* * * * *